United States Patent
Blednov

(10) Patent No.: US 9,503,030 B2
(45) Date of Patent: Nov. 22, 2016

(54) RADIO FREQUENCY POWER AMPLIFIER

(71) Applicant: Igor Ivanovich Blednov, Toulouse (FR)

(72) Inventor: Igor Ivanovich Blednov, Toulouse (FR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/660,532

(22) Filed: Mar. 17, 2015

(65) Prior Publication Data

US 2016/0112012 A1   Apr. 21, 2016

(30) Foreign Application Priority Data

Oct. 17, 2014   (WO) .................. PCT/IB2014/002475

(51) Int. Cl.
| | |
|---|---|
| *H04B 1/38* | (2015.01) |
| *H04M 1/00* | (2006.01) |
| *H03F 1/02* | (2006.01) |
| *H03F 3/195* | (2006.01) |
| *H04W 88/08* | (2009.01) |

(52) U.S. Cl.
CPC ............ *H03F 1/0288* (2013.01); *H03F 3/195* (2013.01); *H03F 2200/451* (2013.01); *H04W 88/08* (2013.01)

(58) Field of Classification Search
CPC .. H03F 1/0288; H03F 1/07; H03F 2200/102; H03G 3/3042; H04B 1/0458
USPC .................................. 330/124 R; 455/74, 571
See application file for complete search history.

(56) References Cited

U.S. PATENT DOCUMENTS

| | | | |
|---|---|---|---|
| 7,078,976 B2 | 7/2006 | Blednov | |
| 2005/0231286 A1* | 10/2005 | Gotou | H03F 1/0288 330/295 |
| 2006/0238245 A1* | 10/2006 | Carichner | H03F 1/0205 330/136 |
| 2006/0246855 A1* | 11/2006 | Kato | H04B 1/0483 455/102 |
| 2010/0026387 A1 | 2/2010 | Blednov | |
| 2011/0169590 A1* | 7/2011 | Namerikawa | H01P 5/12 333/136 |
| 2014/0145791 A1* | 5/2014 | Svechtarov | H03F 1/0288 330/295 |

* cited by examiner

*Primary Examiner* — Ayodeji Ayotunde

(57) ABSTRACT

A radio frequency power amplifier comprises an input and output terminals, a main and peak amplifier stages, and an output power combiner for combining a main output signal and a peak output signal into an output signal. The output power combiner comprises a first combiner terminal electrically coupled to a main output terminal, a second combiner terminal electrically coupled to a peak output terminal, a first transition structure extending from the first combiner terminal in a first direction to a first end, a second transition structure extending from the second combiner terminal in the first direction to a second end, a first electrical conductor arranged between the first and the second ends, and a second electrical conductor arranged between the second combiner terminal and the output terminal. The first electrical conductor extends in a second direction perpendicular to the first direction. The second electrical conductor extends in the first direction.

20 Claims, 8 Drawing Sheets

RADIO FREQUENCY POWER AMPLIFIER

CROSS REFERENCE TO RELATED APPLICATION(S)

The present application claims priority to International Patent Application No. PCT/IB2014/002475, entitled "A RADIO FREQUENCY POWER AMPLIFIER," filed on Oct. 17, 2014, the entirety of which is herein incorporated by reference.

FIELD OF THE INVENTION

This invention relates to a radio frequency power amplifier, a radio frequency integrated circuit package, a radio frequency base station and a communications system.

BACKGROUND OF THE INVENTION

A radio frequency (RF) power amplifier (PA) is a device for receiving an input RF signal having an input power and generating an output RF signal that has an output power which is larger than the input power. The input RF signal can be, e.g., an input current and/or an input voltage. The output RF signal can be, e.g., an output current and/or an output voltage. An RF PA may also be referred to simply as an amplifier. The power ratio of the output RF signal with respect to the input RF signal is commonly referred to as the power gain. An ideal amplifier has a power gain that is independent of the power of the input RF signal. In practice, however, an RF amplifier is not able to output an arbitrarily high power. The power gain of an amplifier therefore tends to become smaller with increasing input power. For example, the power gain may be limited by a maximal output current capability of the RF PA. The power domain of the input RF signal for which the power gain may be considered constant is known as the linear domain or linear regime. When the input power exceeds the linear domain, the amplifier is commonly said to be saturated or to work in the saturation regime.

Typically, RF PAs operational in the linear domain or linear regime, i.e. at low or intermediate input power levels, are less power efficient than RF PAs operational in the saturation regime, i.e. at high input power levels. A RF PA operational in the linear regime may have enhanced linearity but lower power efficiency than a PA operational in the saturation regime.

Techniques are described in literature to improve the power efficiency at low and intermediate input power levels while maintaining the power efficiency in the saturation regime. An example of such techniques is shown in U.S. Pat. No. 7,078,976 B2. U.S. Pat. No. 7,078,976 B2 describes an example of a Doherty power amplifier with a main amplifier stage and a peak amplifier stage both connected with an input power splitter at the input, and with an output power combiner at the output.

The output power combiner is integrated in one package by means of lumped capacitors and bond wires. However, integration of the output power combiner in the package may require that a large amount of layout space of the package is dedicated to the integration of the output power combiner, thereby increasing the costs of the package. Further, the package integrates large active dies, e.g. with gate periphery larger than 60 mm, and uses a wide output lead that generates parasitic distributed inductances and capacitances. As a consequence, a large impedance variation may be seen by the main amplifier stage along a lateral direction of the main amplifier stage, thereby resulting in a non-uniform loading of the main amplifier stage and poor Doherty performance.

SUMMARY OF THE INVENTION

The present invention provides a radio frequency power amplifier, a radio frequency integrated circuit package, a radio frequency base station and a communications system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Hereinafter for describing the Figures, if not otherwise stated, the following conventions are used: black dots indicate electrical nodes or electrical terminals, continuous lines connecting two points in a circuit or layout indicate a direct electrical connection, dashed lines connecting two black dots in a circuit or layout indicate an electrical coupling between the two nodes or terminals, i.e. one or more components may be used between the two points to electrically connect the two points.

Figure 1:
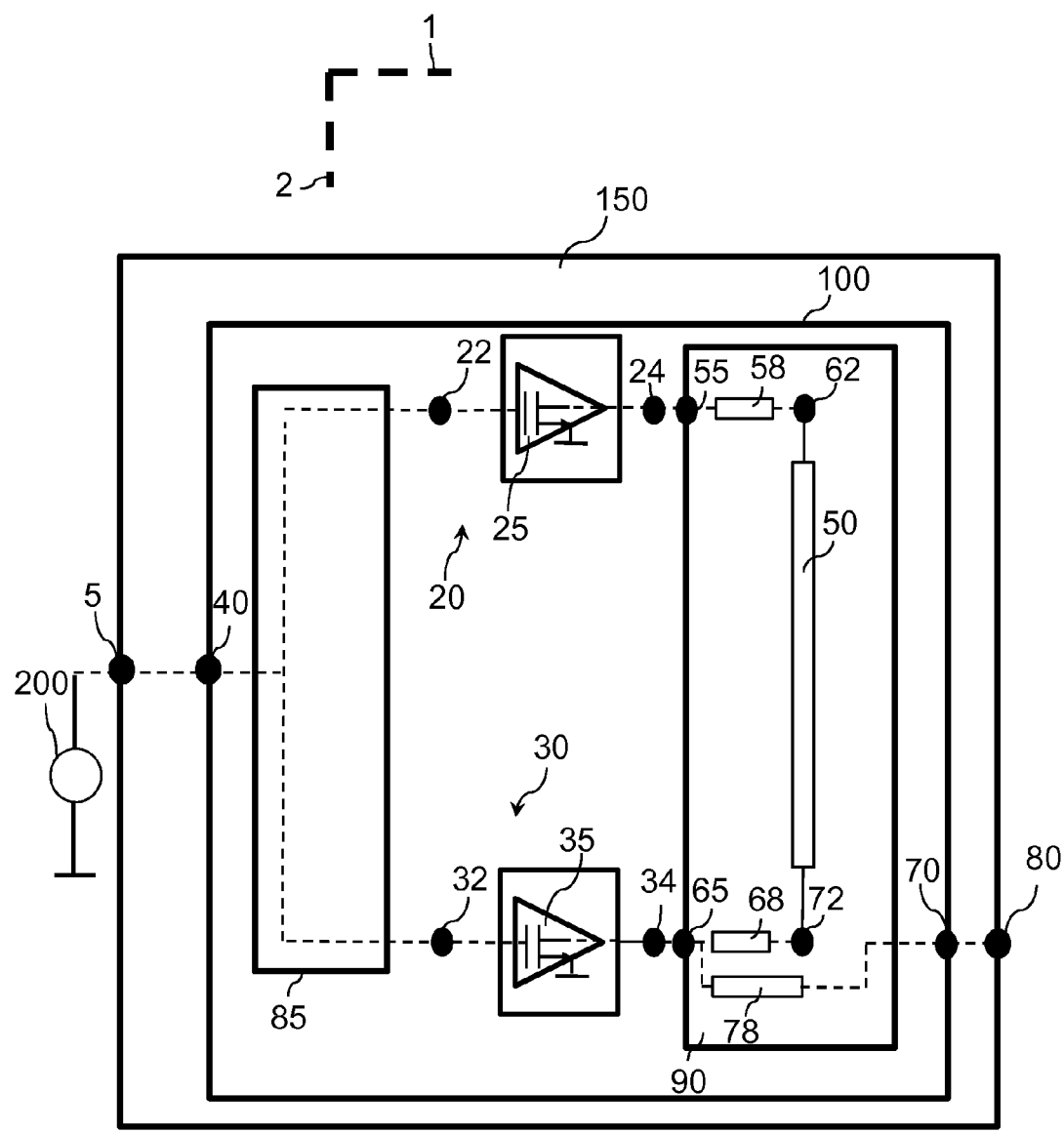
FIG. 1 schematically shows an equivalent circuit diagram of a radio frequency power package.

FIG. 1 shows an equivalent circuit of a radio frequency (RF) integrated package 150. The RF integrated circuit package 150 comprises a RF power amplifier 100. The RF power amplifier 100 has an input terminal 40 for receiving an input RF signal and an output terminal 70 for outputting an output RF signal. The input RF signal has an input power and the output RF signal has an output power which is larger than the input power.

The input RF signal may be generated by a power source 200. The input RF signal has an input power level which is amplified by the RF power amplifier 100 to a higher output power level of the output RF signal.

The power source 200 may be for example a suitable signal generator or a previous amplifying stage suitable for the specific implementation.

The input terminal 40 may be electrically coupled to an input lead 5 of the RF integrated circuit package 150. The output terminal 70 may be electrically coupled to an output lead 80 of the RF integrated circuit package 150.

The RF power amplifier 100 further comprises two amplifier stages: a main amplifier stage 20 and a peak amplifier stage 30. The main amplifier stage 20 has a main input terminal 22 and a main output terminal 24. The peak amplifier stage 30 has a peak input terminal 32 and a peak output terminal 34. The main amplifier stage 20 and the peak amplifier stage 30 may be implemented in any manner suitable for the specific implementation.

For example, the main amplifier stage 20 may include at least a main power transistor 25 and the peak amplifier stage 30 may include at least a peak power transistor 35, both schematically drawn in FIG. 1 with the symbol of a Metal-Oxide-Semiconductor Field Effect Transistor (MOSFET). However, other type of transistors may be used in place of MOSFETs, for example bipolar transistors (BJTs) or hetero-junction bipolar transistors (HBJTs) or Junction or Metal-Semiconductor field effect transistors (JFETs or MESFET) may be also used.

The main power transistor 25 has a main transistor input terminal, a main transistor output terminal and a main transistor reference terminal, e.g. a gate terminal, a drain terminal and a source terminal in the case of a MOSFET device. The main transistor input terminal is electrically coupled to the main input terminal 22. The main transistor output terminal is electrically coupled to the main output terminal 24. The peak transistor input terminal is electrically coupled to the peak input terminal 32. The peak transistor output terminal is electrically coupled to the peak output terminal 34. The main transistor reference terminal and the peak transistor reference terminal are both connected to a reference potential, e.g. the ground.

Alternatively, in an example not shown in the Figures, the main amplifier stage 20 may be formed by a first plurality of transistors connected in parallel at the respective main transistor input terminal, main transistor output terminals and main transistor reference terminals. Similarly, the peak amplifier stage 30 may be formed by a second plurality of transistors connected in parallel at the respective peak transistor inputs, peak transistor outputs and peak transistor reference terminals.

Sizing of the main amplifier stage 20 and the peak amplifier stage 30 depends on power handling capabilities of the RF power amplifier 100 and mode of operation. For output powers larger than 100 W, the gate periphery, i.e. a total width of the gate, of the main amplifier stage 20 or the peak amplifier stage 30, may be e.g. larger than 60 mm.

For example, the main power transistor may have a first area and the peak power transistor may have a second area. For a symmetrical Doherty mode of operation, the first area may be substantially equal to the second area.

Alternatively, for so-called asymmetrical Doherty mode of operation, the area of the main amplifier stage 30 may be different from the area of the peak amplifier stage 30. For example, the area of the main amplifier stage 20 may be half the size of the area of the peak amplifier stage 30.

The main input terminal 22 and the peak input terminal 32 may be both electrically coupled to the input terminal 40 via an input power splitter 85. The main input terminal 22 is arranged to receive a main input RF signal. The peak input terminal 32 is arranged to receive a peak input RF signal. The main input RF signal and the peak input RF signal have a respective power fraction of the input power. The input power splitter 85 may provide to the main input terminal 22 the main input signal having a first predetermined power fraction of the input power. The input power splitter 85 may provide to the peak input terminal 32 the peak input signal having a second predetermined power fraction of the input power.

The first predetermined power fraction may be, e.g. smaller, than the second predetermined power fraction. The main input RF signal and the peak input RF signal may have a relative phase shift of substantially 90 degrees.

The input power splitter 85 may be implemented in any manner suitable for specific implementation. For example, the input power splitter 85 may be integrated inside the RF integrated circuit package 150, as shown in FIG. 1, or outside the RF integrated circuit package 150. In the RF integrated circuit package 150, a single input lead 5 is drawn. However, the RF integrated circuit package may have two separated input leads electrically coupled to the respective main input terminal 22 and peak input terminal 32. The input power splitter 85 may for example be arranged in a printed circuit board (PCB) external to the RF integrated circuit package 150 and electrically coupled to the two separated input leads.

The main output terminal 24 and peak output terminal 34 output respective output RF signals, i.e. a main output RF signal and a peak output RF signal. The main output terminal 24 and peak output terminal 34 are electrically coupled to the output 70 via an output power combiner 90 combining said main output RF signal and peak output RF signal, into the output RF signal at the output terminal 70. The output power combiner 90 has, as shown in FIG. 1, a first combiner terminal 55 electrically coupled to the main output terminal 24 for receiving the main output RF signal from the main output terminal 24 and a second combiner terminal 65 electrically coupled to the peak output terminal 34 for receiving the peak output RF signal from the peak output terminal 34.

The output power combiner 90 further comprises a first transition structure 58 extending from the first combiner terminal 55 in a first direction 1 to a first end 62, and a second transition structure 68 extending from the second combiner terminal 65 in the same first direction 1 to a second end 72. The first direction 1 is indicated in FIG. 1 with a thick dashed line. The output power combiner 90 comprises a first electrical conductor 50 arranged between the first end 62 of the first transition structure 58 and the second end 72 of the second transition structure 68. Further, the output power combiner 90 comprises a second electrical conductor 78 arranged between the second combiner terminal 65 and the output terminal 70 so as to provide the output RF signal to the output terminal 70.

The main output terminal 24 is electrically connected to the output terminal 70 via the first transition structure 58, the first electrical conductor 50, the second transition structure 68 and the second electrical conductor 78. The first electrical conductor 50 extends in a second direction 2. The second electrical conductor 78 extends in the first direction 1. The second direction 2 is perpendicular to the first direction 1. The second direction is indicated in FIG. 1 with another thick dashed line.

The output power combiner 90 allows to control a load of the main amplifier stage 20 by using the second predetermined power fraction amplified by the peak amplifier stage 30. When the input power is in a linear domain of the main amplifier stage 20, the peak amplifier stage 30 may be switched off (e.g. a bias current or voltage of the peak amplifier may be reduced) to save energy and improve efficiency. The linear domain may be below an average power level of the input RF signal. The input RF signal may be modulated e.g. in frequency, amplitude or phase domain. When the input power exceeds the linear domain of the main amplifier stage 20, however, the peak amplifier stage 30 may be switched on to assist the main amplifier stage 20 in generating the output RF signal and at the same time enhancing a load impedance seen by the main amplifier stage 20. The RF power amplifier 100 therefore may have a linear domain that is larger than both a linear domain of the main amplifier stage 20 and a linear domain of the peak amplifier stage 30.

The main amplifier stage 20 and the peak amplifier stage 30 together with the output power combiner 90 may be integrated in the RF integrated circuit package 150. The input lead 5 and the output lead 80 are used to electrically connect the RF power amplifier 100 to an external circuit. The external circuit may for example be implemented on an external printed circuit board (PCB) in order bring into operation the RF power amplifier 100, thus connecting it to, e.g., the power source 200 and/or to a bias circuitry for biasing the main amplifier stage 20 and the peak amplifier stage 30.

Figure 2:
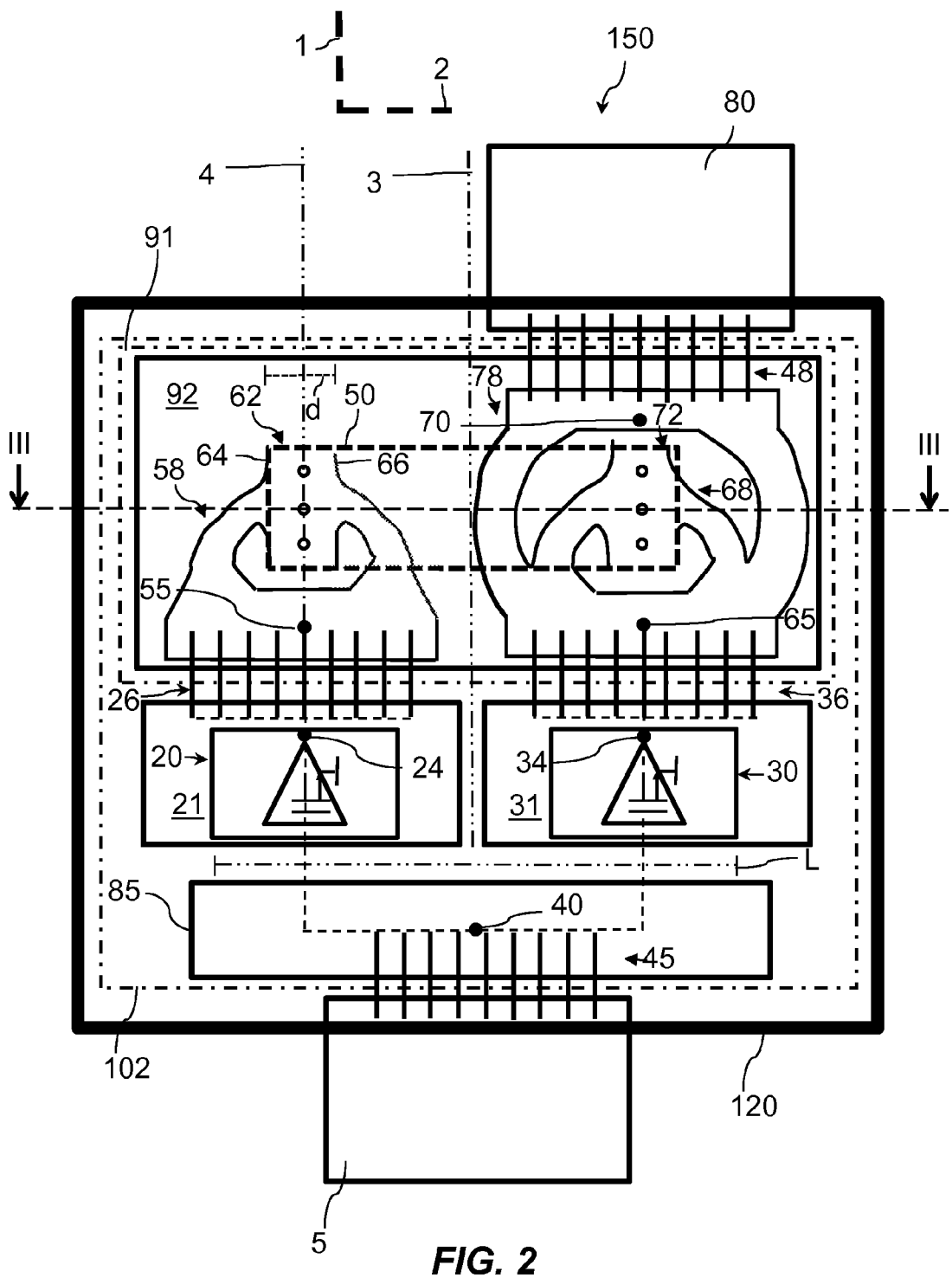
FIG. 2 shows a top view of an example of a radio frequency integrated circuit package, performing according to the equivalent circuit diagram of FIG. 1.

The RF integrated circuit package 150 will be further described with reference to the example of FIG. 2. FIG. 2 shows a top view of an example of a radio frequency integrated circuit package 150, performing according to the equivalent circuit diagram shown in FIG. 1.

The RF integrated circuit package 150 comprises the input lead 5, the output lead 80, a RF power amplifier 102 and a supporting means 120 on which the input lead 5, the output lead 80 and the RF power amplifier 102 are mounted or attached.

The input lead 5 is electrically connected to the input terminal 40 via a first plurality of bond wires 45. The output lead 80 is electrically connected to the output terminal 70 via second plurality of bond wires 48. However, other types of electrical conductive connections may be used, e.g. metal lines, conductive lines pressed or soldered to the respective input and output leads 5 and 80.

The RF power amplifier 100 comprises the input power splitter 85, the main amplifier stage 20, the peak amplifier stage 30 and an output power combiner circuit 91.

The main amplifier stage 20, the peak amplifier stage 30 and the output put combiner circuit 91 may be integrated in a first semiconductor die 21, in a second semiconductor die 31 and in a third semiconductor die 92, respectively. The first semiconductor die 21, the second semiconductor die 31 and the third semiconductor die 92 may be arranged in respective areas of the supporting means 120.

The main amplifier stage 20 and the peak amplifier stage 30 may have respective physical structures arranged to be aligned in the second direction 2.

For example, when the main amplifier stage 20 is integrated in the first semiconductor die 21 and the peak amplifier stage 30 is integrated in the second semiconductor die 22, the first semiconductor die 21 may be aligned with the second semiconductor die 22 in the second direction. For example, the first semiconductor die 21 and the second semiconductor die 22 may have substantially a rectangular cuboid shape. Respective sides of the rectangular cuboids may be aligned in the second direction 2.

However, as shown later in the Figures the main amplifier stage, the peak amplifier stage and the output power combiner circuit may be integrated in a single semiconductor die mounted on the supporting means in which case the main amplifier stage 20 and the peak amplifier stage 30 may have respective physical structures aligned in the second direction 2 in the same single semiconductor die.

The first combiner terminal 55 may be electrically coupled to the main output terminal 24 via a first plurality of bond wires 26. The second combiner terminal 65 may be electrically coupled to the peak output terminal 34 via a second plurality of bond wires 36. The first combiner terminal 55 extends in the second direction 2, i.e. in a direction where the bond wires 26 are separated from each other. Similarly, the second combiner terminal 65 extends in the second direction 2. The first transition structure 58 extends from the first combiner terminal 55 in the first direction 1 to a first end 62. The second transition structure 68 extends from the second combiner terminal 65 in the first direction 1 to a second end 72.

The first electrical conductor 50 extends in the second direction 2 perpendicular to the first direction 1. The first electrical conductor 50 is arranged between the first end 62 of the first transition structure 58 and the second end 72 of the second transition structure 68. The second electrical conductor 78 extends in the first direction 1 from the second combiner terminal 65 to the output terminal 70. The second electrical conductor 78 may be implemented planar to the first transition structure 58 and the second transition structure 68.

By having the second electrical conductor 78 extending in the first direction 1 perpendicular to the second direction 2, the mutual electromagnetic coupling between the first electrical conductor 50 and the second electrical conductor 78 may be substantially reduced. Similarly, mutual electromagnetic coupling between the first and second transition structures 58 and 68 and the first electrical conductor 50 may be reduced. Further, since impedance transformation occurs in successive transitions, impedance loading of the main amplifier stage 20 and the peak amplifier stage 30 along the second direction 2 is more uniform than in conventional prior-art solutions.

The main amplifier stage 20 and the peak amplifier stage 30 may extend both within an extension length L along the second direction 2. For example, the first semiconductor die 21 may be aligned with the second semiconductor die 31 in the second direction 2 along a respective side.

The first transition structure 58 and the second transition structure 68 may be implemented in any manner suitable for the specific implementation.

For example, the first transition structure 58 and the second transition structure 68 may be reflectional symmetric with respect to a first axis of symmetry 3 having the first direction. The first axis of symmetry passes through a point located at half way of the extension length L.

The first transition structure 58 may have a first transition portion arranged to electrically connect a first side edge 64 of the first end 62 to the first combiner terminal 55. The first transition structure 58 may have a second transition portion arranged to electrically connect a second side edge 66 of the first end 62 to the first combiner terminal 55. The second side edge 66 is opposite to the first side edge 64 along the second direction 2. The first transition structure 58 may be arranged to be reflectional symmetric with respect to a second axis of symmetry 4 having the second direction 2.

The second axis of symmetry 4 passes through a point located at half a side distance d of the first side edge 64 to the second side edge 66.

The second transition structure 68 may be arranged in a manner similar to the first transition structure 58. In fact, the second transition structure 68 may be a mirrored implementation of the first transition structure 58 with reference to the first axis of symmetry 3.

Symmetry of the first and second transition structures 58 and 68 enhances uniform impedance transformation from the first combiner terminal 55 and the second combiner terminal 65 to the first end 62 and second end 72, respectively. Load impedance offered to the main amplifier stage 20 and to the peak amplifier stage 30 is more uniform along the second direction 2 which may prevent stability and ruggedness issues.

The output power combiner circuit 91 may be implemented in any manner suitable for the specific implementation.

Figure 3:
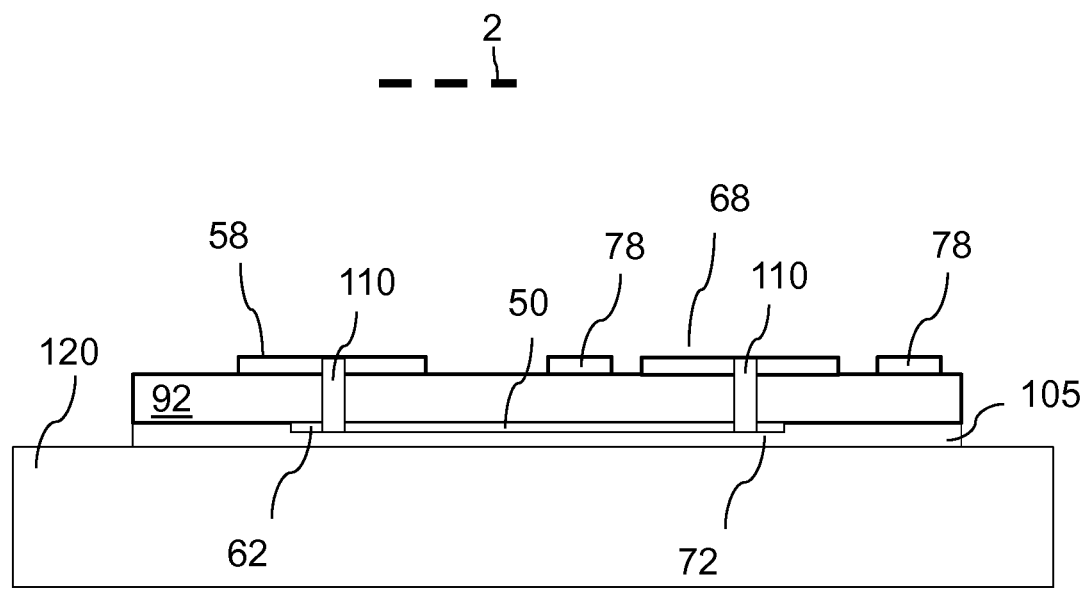
FIG. 3 shows a cross section of the example shown in FIG. 2 take along the line III-III in FIG. 2.

FIG. 3 shows a cross section of the RF integrated circuit package 150 taken along the line III-III in FIG. 2.

With reference to FIG. 3, the third semiconductor die 92 has a plurality of layers. The first electrical conductor 50 may be implemented in one layer and the first transition structure 58 and the second transition structure 68 may be implemented in a different layer. For example, the first transition structure 58 and the second transition structure 68 may partially overlap the first electrical conductor 50. The first transition structure 58 and the second transition structure 68 may be implemented on a top metal layer while the first electrical conductor 50 may be integrated in an intermediate metal layer. The intermediate metal layer may be connected at the first end 62 and at the second end 72 to the top metal layer via a plurality of electrically conductive vias 110. The first transition structure 58, the second transition structure 68 and the first electrical conductor 50 are made of metal, e.g. copper or another electrically conductive material. The third semiconductor die 92 may be attached to the supporting means 120 by e.g. an electrically isolating layer 105. The third semiconductor die 92 may be in thermal contact with the supporting means 120 through the electrically isolating layer 105 such that heat generated in the RF power amplifier can be dissipated to the supporting means 120. The electrically isolating layer 105 may be e.g. a non-electrically conductive epoxy or another type of suitable non-conductive glue with suitable dielectric constant and thermal conductivity. The supporting means 120 may be thermally conductive and be made of electrically conductive material. The supporting means 120 may be electrically connected to the reference potential, e.g. to the ground or to a negative potential. The first electrical conductor 50 may form with the supporting means 120 a distributed shunt capacitance and series inductance. The shunt capacitance has the first electrical conductor 50 as a top plate, the supporting means as a bottom plate and the electrically isolating layer 105 as a dielectric layer in between. The distributed capacitance and distributed inductance may be effective at radio frequencies to tune output parasitic capacitances of main and peak amplifier stages.

The third semiconductor die 92 may be a dedicated die suitable to integrate passive components. For example, the third semiconductor die 92 may be processed with a high-resistivity substrate allowing integrating high-quality factors passive components. Electrical isolation from the supporting means 120 via the electrically isolating layer 105 and the use of a high-resistivity substrate, allow to effectively design the first electrical conductor 50 with relatively low characteristic impedances, e.g. lower than 5 Ohms.

The first electrical conductor may be implemented in any manner suitable for the specific implementation.

In the example shown in FIG. 3, the first electrical conductor 50 is closer to the supporting means 120, i.e. the reference plane, than the first transition structure 58, the second transition structure 68 and the second electrical conductor 78. In this example mutual electromagnetic coupling between components in the third semiconductor die 92 may be reduced.

Alternatively, the first electrical conductor 50 may be formed by several parallel conductors arranged in parallel, e.g. parallel metal strip lines, such that relatively high RF currents flowing through the first electrical conductor 50 may be handled.

Figure 4:
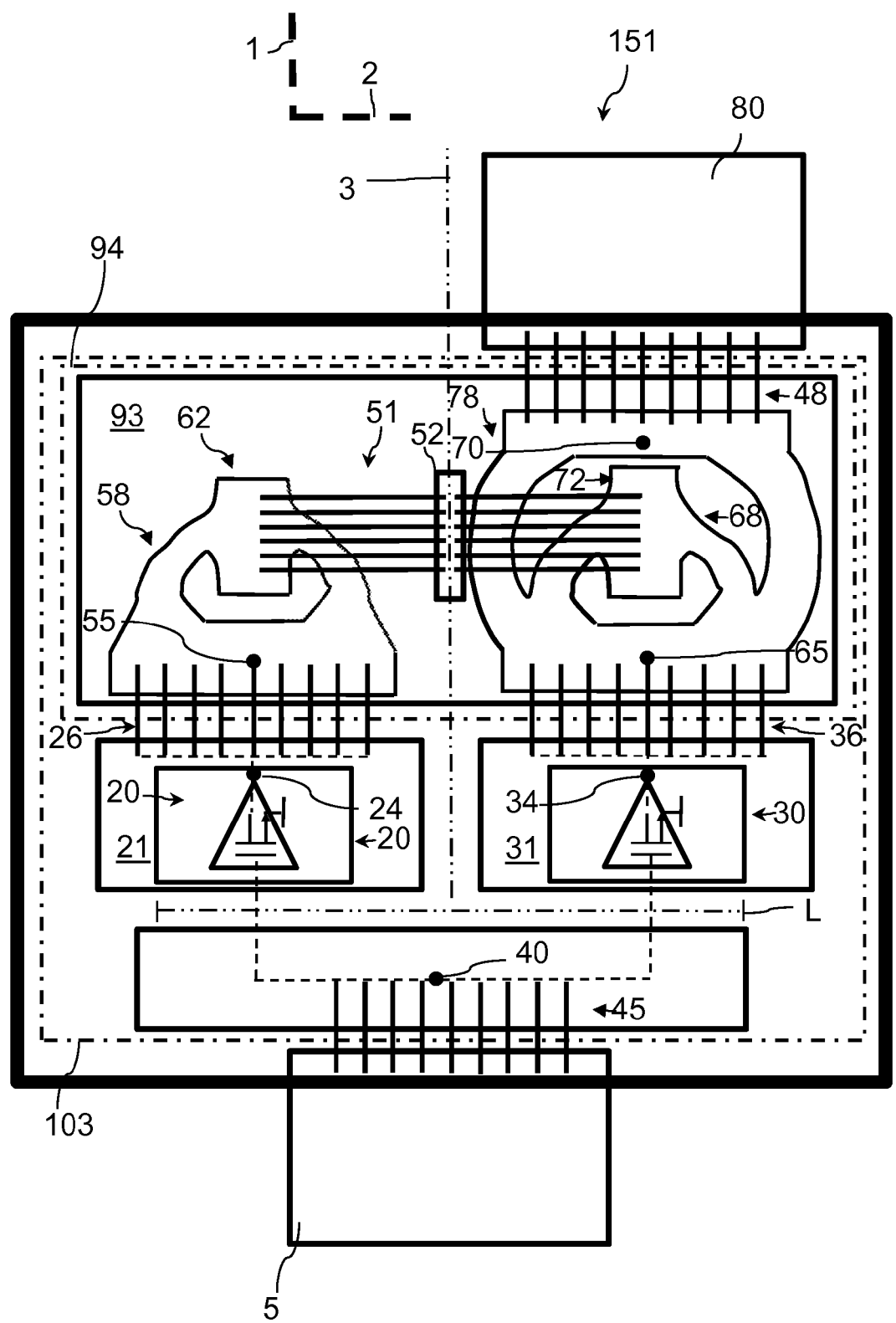
FIG. 4 shows a top view of an example of a radio frequency integrated circuit package.

FIG. 4 shows another example of a RF integrated circuit package 151. The RF integrated circuit package 151 differs from the RF integrated circuit package 150 shown in FIG. 2 in that the first electrical conductor is formed by a plurality of parallel bond wires 51. The RF power amplifier 103 is implemented similarly to the RF power amplifier 102: the first stage 20 is integrated in a first semiconductor die 21, the second stage 30 is integrated in a second semiconductor die 31, and the output power combiner 94 is integrated in a third semiconductor die 93, e.g. an integrated passive die as e.g. described with reference to FIG. 3. The first end 62 and the second end 72 of the respective first transition structure 58 and second transition structure 68 may be electrically connected via the plurality of bond wires 51. The bond wires 51 may be bonded via a bonding pad 52 to the respective first end 62 and second end 72. The bonding pad 52 may be centrally located with respect to the first axis of symmetry 3. The bonding pad 52 allows to tune the first electrical conductor to the desired phase shift and characteristic impedance. The bonding pad 52 may provide with the supporting means 120, e.g. connected to the ground, an additional shunt capacitance of suitable value. Length and height of the bond wires 51 may be adjusted during manufacturing of the RF power amplifier 151 on a product basis so that assembly and process variations are taken into account during the tuning process for specific frequency band.

As shown in FIG. 4, the first electrical conductor formed by the plurality of bond wire 51 may partly overlap the second transition structure 68 and the second electrical conductor 78.

The second electrical conductor 78 may be implemented in any manner suitable for the specific implementation.

Figure 5:
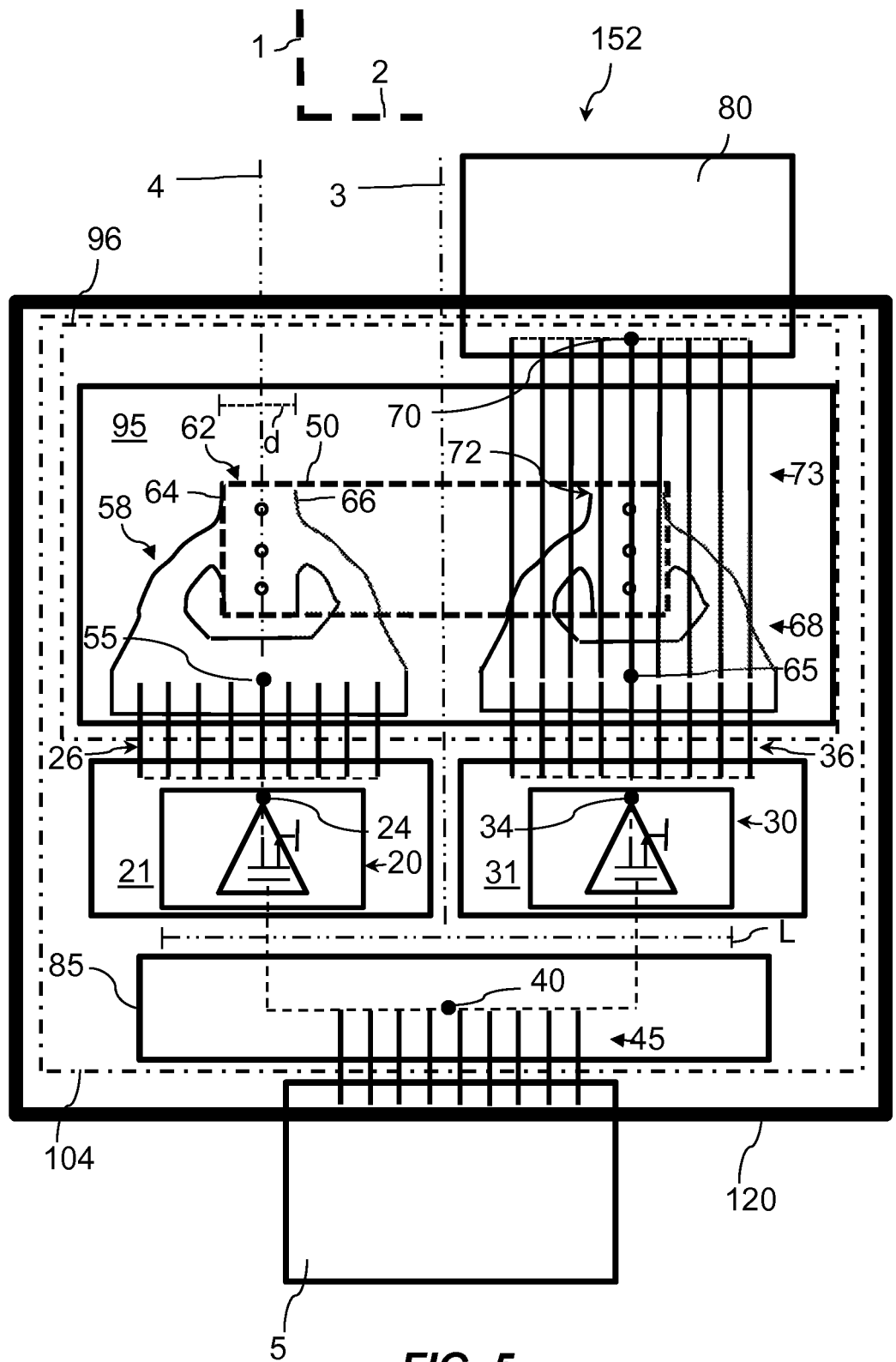
FIG. 5 shows a top view of an example of a radio frequency integrated circuit package.

For example, FIG. 5 shows an example of a RF integrated circuit package 152. Herewith parts having the same reference numbers as in FIG. 2 are not described in detail. The RF integrated circuit package 152 comprises a RF power amplifier 104. The RF power amplifier 104 is implemented by using at least a first semiconductor die 21, a second semiconductor die 31 and a third semiconductor die 95. An output power combiner 96 is integrated in the third semiconductor die 95. The output power combiner 96 differs from the output power combiner 91 shown in FIG. 2 in that the second electrical conductor is formed by a plurality of bond wires 73 directly connecting the second combiner terminal 65 to the output terminal 70. In this example the output terminal 70 coincides with respective second ends of the bond wires 73 adjacent to the output lead 80. The first transition structure 58, the second transition structure 68 and the first electrical conductor 50 may form a metal path e.g. through multiple layers in the semiconductor die 95. This metal path is reflectional symmetric with reference to the first axis of symmetry 3. Symmetry in the third semiconductor die 95 is thus enhanced. The bond wires 73 are crossing the first electrical conductor 50 in the first direction 1, i.e. in a direction orthogonal to the extension length L, thereby reducing the electromagnetic mutual coupling between the bond wires 73 and the first electrical conductor 50. Further, the number of bond wires 73 may be increased or reduced and/or the bond wires 73 may be tuned in height and length to achieve the desired inductance and ensure proper power capabilities.

With reference to FIG. 2, FIG. 4 and FIG. 5, the second transition structure 68 is formed such that the second end 72 is arranged to extend for a first length in the first direction 1 and for a second length in the second direction 2. The first length may be larger than the second length. The second end 72 may be separated from the second combiner terminal 65 and the output terminal 70. The second end 72 may be arranged at a distance from the second combiner terminal 65 and the output terminal 70. The second end 72 (and for symmetry the first end 62) may have a rectangular shape with a longer side of the rectangular shape extending in the first direction 1, and a shorter side of the rectangular shape extending in the second direction 2. Extension of the second end 72 in the first direction 1 allows to design a wide first electrical conductor with relatively low characteristic impedance, e.g. lower than 5 Ohms, and capable to handle large RF currents. Limiting the extension of the second end 72 in the second direction 2, may reduce dimensions of RF integrated circuit package in the second direction 2. Further, the distance of the second end 72 to the first combiner terminal 65 and the output terminal 70 reduces overall metal patterning of the second transition structure 68, thereby reducing parasitic capacitance formed between the second transition structure 68 and the ground. As a consequence, the shape of the second transition structure 68 may be designed to meet a trade-off between RF current handling capabilities of the output power combiner, low characteristic impedance of the first electrical conductor and reduced package dimensions. Similar arguments apply to the first transition structure 58 which is, in the examples described, reflectional symmetric to the second transition structure 68 with reference to the first axis of symmetry 3, thereby having the same shape of the second transition structure 68.

Figure 6:
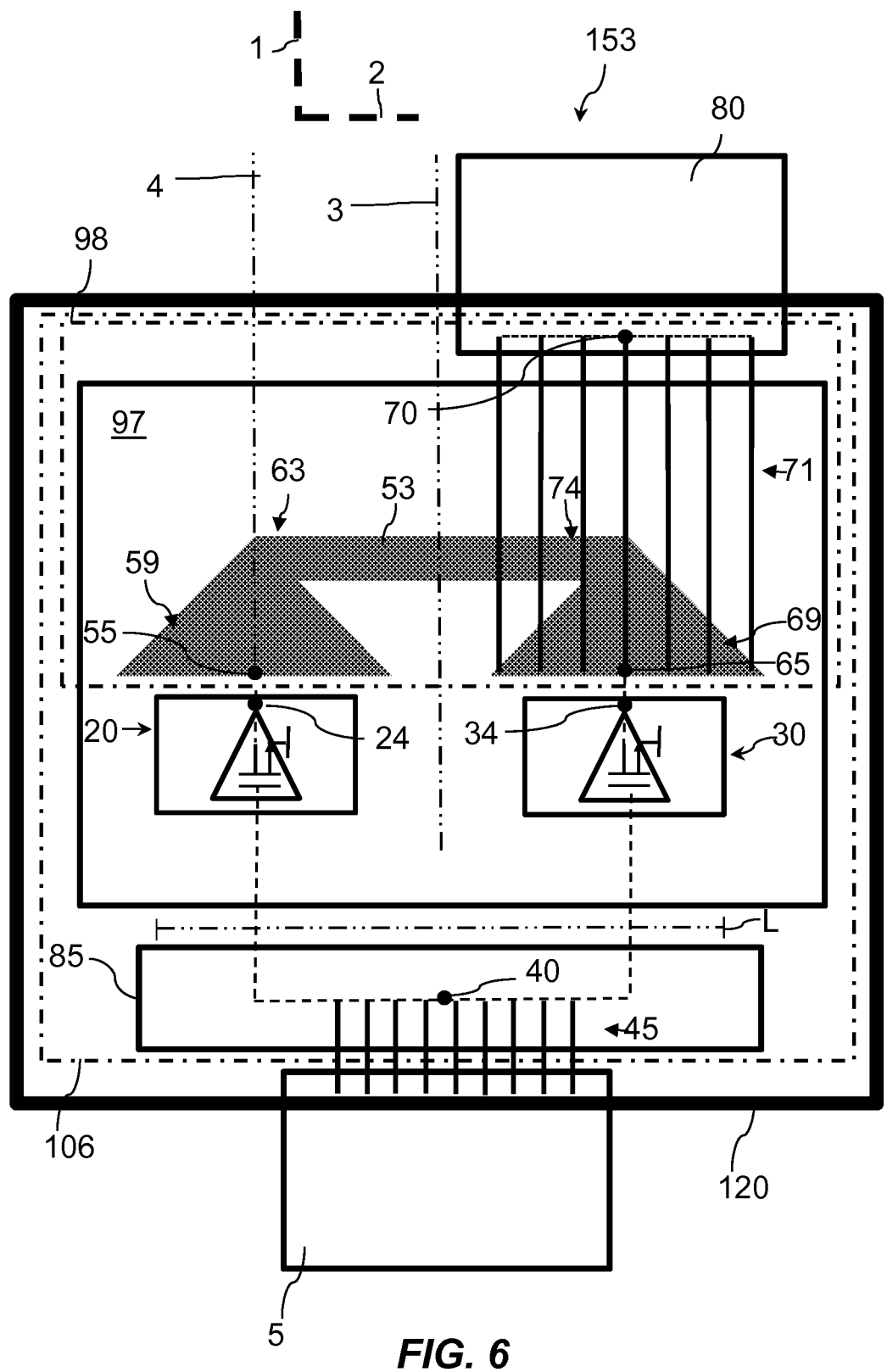
FIG. 6 shows a top view of an example of a radio frequency integrated circuit package.

FIG. 6 shows another example of a RF integrated circuit package 153. The RF integrated circuit package 153 comprises an RF power amplifier 106. The RF power amplifier 106 is implemented such that the main amplifier stage 20, the peak amplifier stage 30 and an output power combiner 98 are integrated in a single semiconductor die 97. The semiconductor die 97 is mounted on the supporting means 120. The semiconductor die 97 may be mounted on the supporting means 120 via an electrically isolating layer (not shown in FIG. 6) as described with reference to the cross-section of FIG. 3. The output power combiner 98 comprises a first transition structure 59 and a second transition structure 69 extending in the first direction 1. The first electrical conductor 53 is electrically connected to a first end 63 of the first transition structure 59 to which the first transition structure 59 extends and to a second end 74 of the second transition structure 69 to which the second transition structure 69 extends. The output power combiner 98 further comprises a second electrical conductor formed by a plurality of bond wires 71 extending from the second combiner terminal 65 to the output terminal 70 in the first direction 1.

The first transition structure 59, the second transition structure 69 and the first electrical conductor 53 may be arranged planar in a metal layer of the semiconductor die 97, e.g. in a top metal layer. The first transition structure 59, the second transition structure 69 and the first electrical conductor 53 form a continuous metal path which is symmetrical with reference to the first axis of symmetry 3. The first transition structure 59 may have a first triangular shape. The second transition structure 69 may have a second triangular shape. The first triangular shape of the first transition structure 59 has a first triangle side corresponding to the first combiner terminal 55 and a first triangle vertex opposite to the first triangle side. The first triangle vertex corresponds to the first end 63 of the first transition structure 59. Similarly, the second triangular shape of the second transition structure 69 has a second triangle side corresponding to the second combiner terminal 65 and a second triangle vertex opposite to the second triangle side. The second triangle vertex corresponds to the second end 74. The first triangular shape is symmetric with reference to the second axis of symmetry 4.

The second electrical conductor formed by the bond wires 71 crosses orthogonally the first electrical conductor 53 and partially overlaps it. Electromagnetic mutual coupling between the first electrical conductor 53 and the bond wires 71 may be thereby reduced. Since the output power combiner circuit 98 is fully integrated in the semiconductor die 97, the RF integrated circuit package 153 may be more compact.

Figure 7:
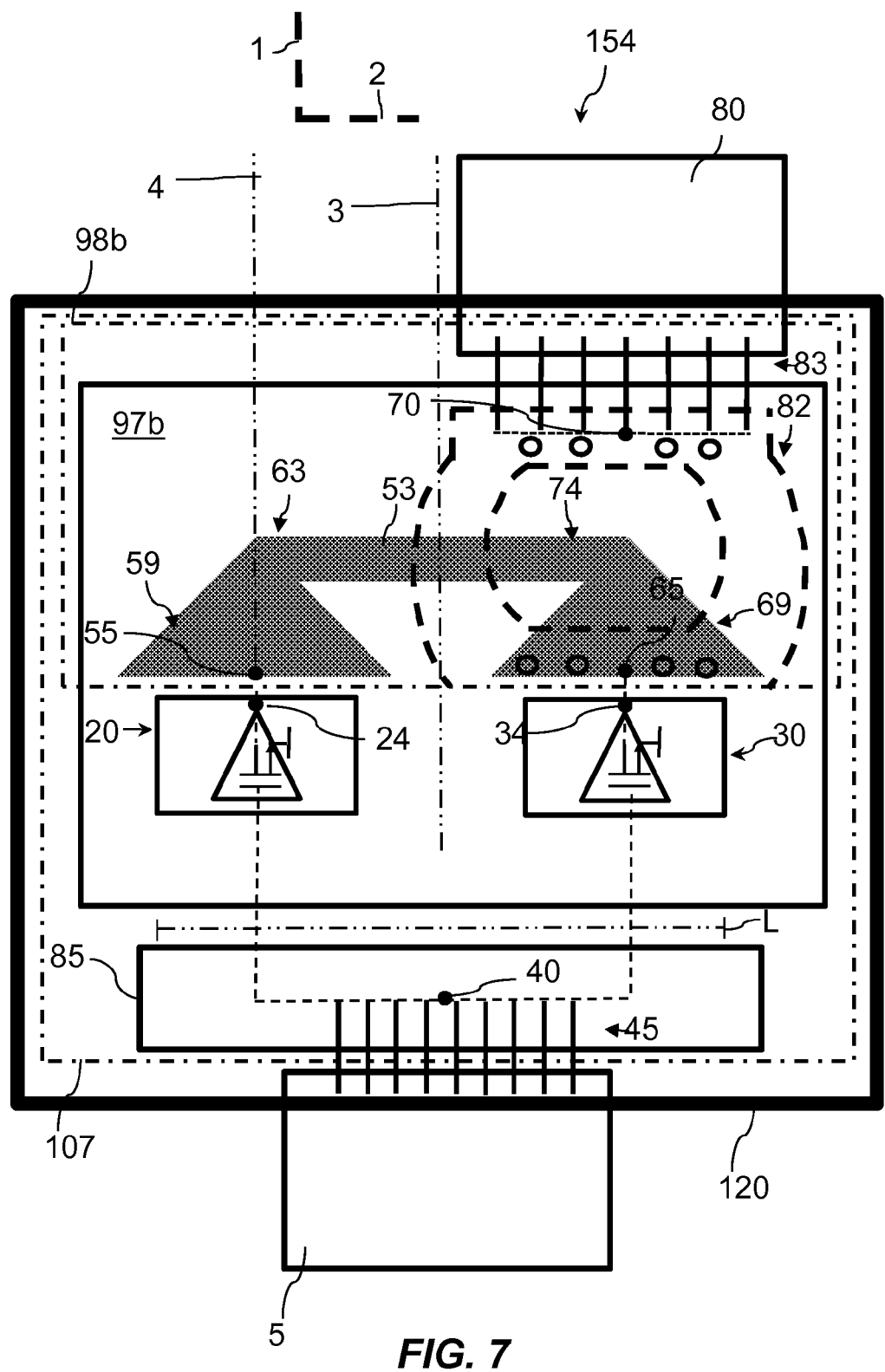
FIG. 7 shows a top view of an example of a radio frequency integrated circuit package.

FIG. 7 shows another example of a RF integrated circuit package 154. The RF integrated circuit package 154 comprises an RF power amplifier 107. The RF power amplifier 107 is implemented such that the main amplifier stage 20, the peak amplifier stage 30 and an output power combiner 98b are integrated in a single semiconductor die 97b. The semiconductor die 97b is mounted on the supporting means 120. The semiconductor die 97 may be mounted on the supporting means 120 via an electrically isolating layer (not shown in FIG. 7). The output power combiner 98b differs from the output power combiner 98 in that the second electrical conductor 82 is implemented in a metal layer of the semiconductor die 97b different from the metal layer where the first and second transition structures 59, 69 and the first electrical conductor 53 are implemented. For example, the second electrical conductor 82 may be implemented in a layer underneath the top layer. The second electrical conductor 82 may be electrically connected to the second combiner terminal 65 by e.g. a plurality of electrically conductive vias (schematically drawn in FIG. 7 with circles on top of the second combiner terminal 65). By implementing the second electrical conductor 82 in a different layer of the semiconductor die 97b, the second electrical conductor 82 may be made larger and higher power may be handled. Further, when the second electrical conductor 82 is placed close to the ground, e.g. in a metal layer above the supporting means 120, transmission of the output RF signal may be enhanced and characteristic impedance of the second electrical conductor 82 may be reduced. Shorter bond wires 83 may be used to connect the output terminal 70 to the output lead 80.

Alternatively, in an example not shown in the FIGs., the second electrical conductor may be implemented in a metal layer above the metal layer containing the first, second transition structures, and the first electrical conductor. In the latter example, the impedance of the second electrical conductor may be better controlled, e.g. parasitic inductances due to vias hole of example of FIG. 7 may be eliminated.

Figure 8:
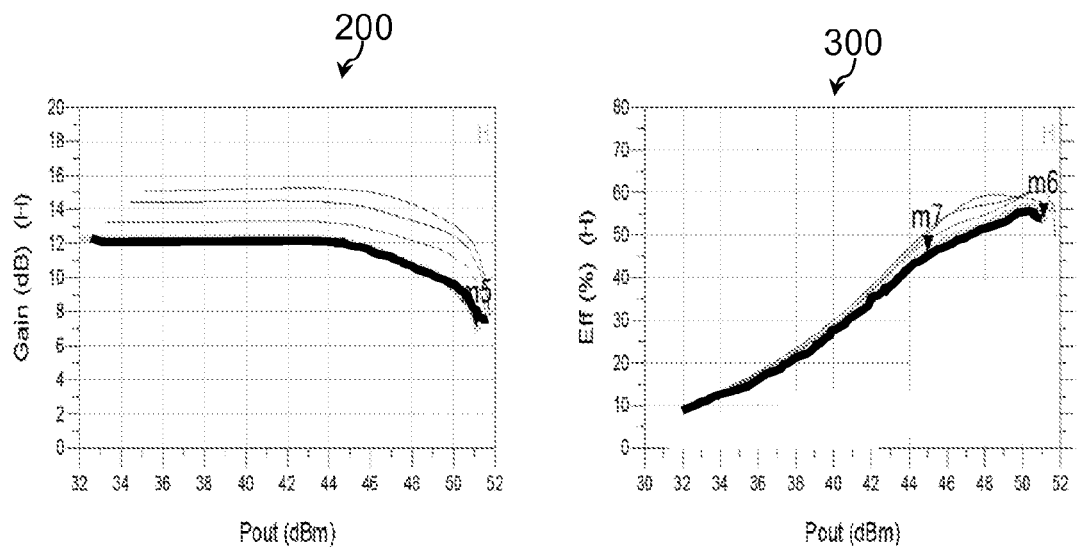
FIG. 8 shows a graph of the gain and efficiency as function of the output power level for the power amplifier according to the example of FIG. 6.

FIG. 8 shows a graph of the gain 200 and a graph of the power efficiency 300 versus output power levels of the RF power amplifier shown in FIG. 6. The gain 200 and the power efficiency 300 are shown for frequencies in the range between 1.8 GHz to 2.17 GHz, i.e. corresponding to substantially 20% bandwidth. The thicker black line in the graphs 200 and 300 indicates respective gain and power efficiency values calculated for the highest frequency in the range, i.e. 2.17 GHz. The gain 200 spreads less than 2 dB up to 46 dBm. The power efficiency is higher than 50% above output power levels of 46 dBm in the frequency range between 1.8 GHz to 2.17 GHz. Maximum output level for the RF power amplifier under test is 125 W. At the maximum output power level the RF power amplifier has a power efficiency of approximately 55%.

Figure 9:
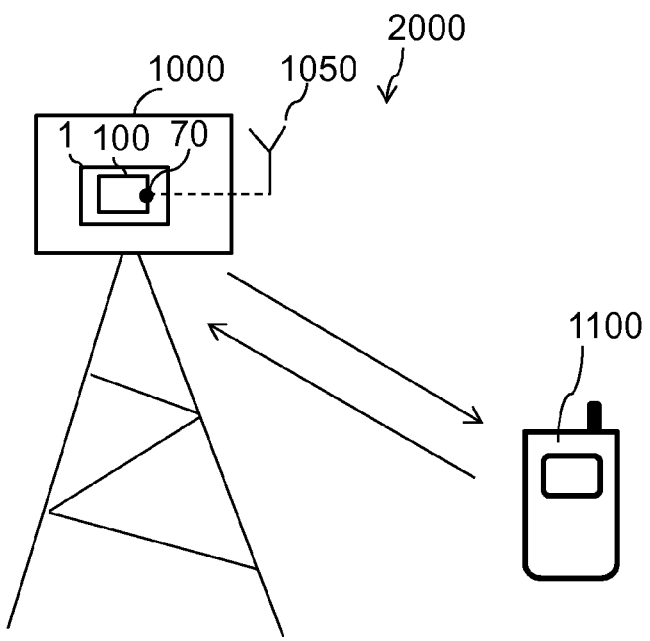
FIG. 9 shows a communications system.

FIG. 9 shows a communications system 2000. The communications system 2000 may be a communications system suitable for wireless transmission. The communications system 2000 comprises a base station 1000 and one or more mobile devices 1100, such as for example a mobile phone. The communications system 2000 is arranged to provide wireless transmission of a signal to one or more of the mobile devices 1100. The base station 1000 comprises a transmitter 1 comprising an RF power amplifier according to an example described above, such as the RF power amplifier 100 described above with reference to FIG. 1 or any of the RF power amplifier 102, 103, 104, 106 or 107 described above with reference to FIGS. 2, 4, 5 and 6. The RF power amplifier 100 is arranged to provide an output RF signal at a radio frequency. The output RF signal may be modulated for example in phase, amplitude or frequency for down-link transmission to at least one of the mobile devices 1100. The base station 1000 may comprise the transmitter 1 comprising the RF power amplifier 100, and an antenna 1050 electrically coupled to the output terminal 70 of the RF power amplifier 100 for transmitting the output RF signal through a communication channel.

In accordance with at least one embodiment, a radio frequency power amplifier comprises an input terminal for receiving an input signal having an input power and an output terminal for outputting an output signal having an output power larger than the input power, a main amplifier stage having a main input terminal for receiving a main input signal and a main output terminal for providing a main output signal, the main input terminal electrically coupled to the input terminal, a peak amplifier stage having a peak input terminal for receiving a peak input signal and a peak output terminal for providing a peak output signal, the peak input terminal electrically coupled to the input terminal, and an output power combiner for combining the main output signal and the peak output signal into the output signal, comprising a first combiner terminal electrically coupled to the main output terminal for receiving the main output signal from the main output terminal and a second combiner terminal electrically coupled to the peak output terminal for receiving the peak output signal from the peak output terminal. The power combiner further comprises a first transition structure extending from the first combiner terminal in a first direction to a first end, a second transition structure extending from the second combiner terminal in the first direction to a second end, a first electrical conductor for providing a phase shift between the main output signal and the peak output signal, the first electrical conductor being arranged between the first end and the second end, and a second electrical conductor arranged between the second combiner terminal and the output terminal for providing the output signal to the output terminal. The first electrical conductor extends in a second direction perpendicular to the first direction. The second electrical conductor extends in the first direction.

In accordance with at least one embodiment, the second electrical conductor comprises a portion extending at opposite sides of the second transition structure in the second direction away from the second transition structure. In accordance with at least one embodiment, the second electrical conductor is arranged to partially overlap the first electrical conductor. In accordance with at least one embodiment, the first electrical conductor is arranged to partially overlap the second transition structure and the second electrical conductor. In accordance with at least one embodiment, the main amplifier stage and the peak amplifier stage have respective physical structures arranged to be aligned in the second direction, the first transition structure and the second transition structure being arranged to be reflectional symmetric with respect to a first axis of symmetry having the first direction. In accordance with at least one embodiment, the first transition structure has a first transition portion and a second transition portion, the first transition portion being arranged to electrically connect a first side edge of the first end to the first combiner terminal, the second transition portion being arranged to electrically connect a second side edge of the first end to the first combiner terminal, the second side edge being opposite to the first side edge along the second direction, the first transition structure being arranged to be reflectional symmetric with respect to a second axis of symmetry having the first direction.

In accordance with at least one embodiment, the first electrical conductor is formed by a metal strip line extending in the second direction. In accordance with at least one embodiment, the first electrical conductor is formed by a plurality of parallel bond wires extending in the second direction between the first end and the second end. In accordance with at least one embodiment, the first electrical conductor has an electrical length substantially equivalent to one-quarter of wavelength for providing a phase shift of substantially 90 degrees. In accordance with at least one embodiment, the second transition structure is formed such that the second end is arranged to extend for a first length in the first direction and for a second length in the second direction, the first length being larger than the second length, and/or to be separated from the second combiner terminal and the output terminal in the second direction. In accordance with at least one embodiment, the first transition structure is formed such to have substantially a triangular shape, the triangular shape having a triangle side corresponding to the first combiner terminal and a triangle vertex opposite to the triangle side substantially corresponding to the first end. In accordance with at least one embodiment, the respective physical structures of the main amplifier stage and the peak amplifier stage extend in the second direction for a first extension length and in the first direction for a second extension length, the first extension length being larger than the second extension length.

In accordance with at least one embodiment, the main amplifier stage comprises at least a main power transistor having a main transistor input terminal, a main transistor output terminal and a main transistor reference terminal, the peak amplifier stage comprising at least a peak power transistor having a peak transistor input terminal, a peak transistor output terminal and a peak transistor reference terminal, the main transistor input terminal being electrically coupled to the main input terminal, the main transistor output terminal being electrically coupled to the main output terminal, the peak transistor input terminal being electrically coupled to the peak input terminal, the peak transistor output terminal being electrically coupled to the peak output terminal, the main transistor and peak transistor reference terminals being both electrically coupled to a reference terminal. In accordance with at least one embodiment, a radio frequency integrated circuit package comprises the radio frequency power amplifier as described above, the radio frequency integrated circuit package comprising a supporting means, an input lead and output lead, the input lead being electrically coupled to the input terminal, the output lead electrically coupled to the output terminal, with the main amplifier stage, the peak amplifier stage and the output power combiner being arranged in respective areas of the supporting means.

In accordance with at least one embodiment, the main amplifier stage is integrated in a first semiconductor die, the peak amplifier stage being integrated in a second semiconductor die and the output power combiner being integrated in a third semiconductor die, the first semiconductor die, the second semiconductor die and the third semiconductor die being mounted on the supporting means. In accordance with at least one embodiment, the main amplifier stage, the peak amplifier stage and the output power combiner are integrated in a single semiconductor die mounted on the supporting means. In accordance with at least one embodiment, the first electrical conductor is integrated in an electrically conductive layer of the third semiconductor die, the first electrical conductor being separated by the supporting means by at least an electrically isolating layer arranged to attach the third semiconductor die to the supporting means, the first electrical conductor being electrically connected to the first combiner terminal and second combiner terminal via electrically conductive via holes extending through the third semiconductor die to the electrically conductive layer. In accordance with at least one embodiment, the supporting means is electrically conductive and electrically connected to a reference potential.

In accordance with at least one embodiment, a radio frequency base station for mobile communications comprises a transmitter comprising the radio frequency integrated circuit package as described above and an antenna electrically coupled to the output lead of the radio frequency integrated circuit package for transmitting the output signal through a communication channel. In accordance with at least one embodiment, the radio frequency base station is arranged to provide wireless transmission to one or more mobile devices.

In the foregoing specification, the invention has been described with reference to specific examples of embodiments of the invention. It will, however, be evident that various modifications and changes may be made therein without departing from the scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The semiconductor active dies 21, 31, or 97 as well the respective power transistors of the respective power amplifier stages 20 and 30 described herein can be manufactured by using any suitable semiconductor technology. The semiconductor technology may be one of the group consisting of: gallium arsenide, gallium nitride, silicon germanium, lateral diffused metal oxide semiconductor (LDMOS), silicon-on-insulator (SOI), silicon, monocrystalline silicon, silicon on carbide and the like, and combinations of the above.

The electrical conductive connections as discussed herein may be illustrated or described in reference to being a single conductor, or a plurality of conductors. Similarly one or more input lead or one or more output lead can be used to connect the input terminal 40 and the output terminal 70. Therefore, many options exist for transferring signals.

Because the RF power amplifier 100, 102, 103, 104, 106 or 107 implementing the present invention is, for the most part, composed of electronic components such as transmission lines, capacitors and/or inductors and circuits known to those skilled in the art, circuit details have not been explained in any greater extent than that considered necessary, for the understanding and appreciation of the underlying concepts of the present invention and in order not to obfuscate or distract from the teachings of the present invention.

Also, devices functionally forming separate devices may be integrated in a single physical device. Also, the units and circuits may be suitably combined in one or more semiconductor devices.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency power amplifier comprising:
an input terminal for receiving an input signal having an input power and an output terminal for outputting an output signal having an output power larger than the input power,
a main amplifier stage having a main input terminal for receiving a main input signal and a main output terminal for providing a main output signal, the main input terminal electrically coupled to the input terminal;
a peak amplifier stage having a peak input terminal for receiving a peak input signal and a peak output terminal for providing a peak output signal, the peak input terminal electrically coupled to the input terminal,
an output power combiner for combining the main output signal and the peak output signal into the output signal, comprising a first combiner terminal electrically coupled to the main output terminal for receiving the main output signal from the main output terminal and a second combiner terminal electrically coupled to the peak output terminal for receiving the peak output signal from the peak output terminal, the power combiner further comprising:

a first transition structure extending from the first combiner terminal in a first direction to a first end, a second transition structure extending from the second combiner terminal in the first direction to a second end, a first electrical conductor for providing a phase shift between the main output signal and the peak output signal, the first electrical conductor being arranged between the first end and the second end, and a second electrical conductor arranged between the second combiner terminal, at an opposite end of the second transition structure opposite the second end, and the output terminal for providing the output signal to the output terminal;

the first electrical conductor extending in a second direction perpendicular to the first direction, the second electrical conductor extending in the first direction.

2. A radio frequency power amplifier as claimed in claim 1, the second electrical conductor comprising a portion extending at opposite sides of the second transition structure in the second direction away from the second transition structure.

3. A radio frequency power amplifier as claimed in claim 1, the second electrical conductor being arranged to partially overlap the first electrical conductor.

4. A radio frequency power amplifier as claimed in claim 1, the first electrical conductor being arranged to partially overlap the second transition structure and the second electrical conductor.

5. A radio frequency power amplifier as claimed in claim 1, the main amplifier stage and the peak amplifier stage having respective physical structures arranged to be aligned in the second direction, the first transition structure and the second transition structure being arranged to be reflectional symmetric with respect to a first axis of symmetry having the first direction.

6. A radio frequency power amplifier as claimed in claim 1, the first transition structure having a first transition portion and a second transition portion, the first transition portion being arranged to electrically connect a first side edge of the first end to the first combiner terminal, the second transition portion being arranged to electrically connect a second side edge of the first end to the first combiner terminal, the second side edge being opposite to the first side edge along the second direction, the first transition structure being arranged to be reflectional symmetric with respect to a second axis of symmetry having the first direction.

7. A radio frequency power amplifier as claimed claim 5, the first electrical conductor being formed by a metal strip line extending in the second direction.

8. A radio frequency power amplifier as claimed in claim 1, the first electrical conductor being formed by a plurality of parallel bond wires extending in the second direction between the first end and the second end.

9. A radio frequency power amplifier as claimed in claim 1, the first electrical conductor having an electrical length substantially equivalent to one-quarter of wavelength for providing a phase shift of substantially 90 degrees.

10. A radio frequency power amplifier as claimed in claim 1, the second transition structure being formed such that
the second end is arranged to extend for a first length in the first direction and for a second length in the second direction, the first length being larger than the second length, and/or to be separated from the second combiner terminal and the output terminal in the second direction.

11. A radio frequency power amplifier as claimed in claim 1, the first transition structure being formed such to have substantially a triangular shape, the triangular shape having a triangle side corresponding to the first combiner terminal and a triangle vertex opposite to the triangle side substantially corresponding to the first end.

12. A radio frequency power amplifier as claimed in claim 7, the respective physical structures of the main amplifier stage and the peak amplifier stage extending in the second direction for a first extension length and in the first direction for a second extension length, the first extension length being larger than the second extension length.

13. A radio frequency power amplifier as claimed in claim 1, the main amplifier stage comprising at least a main power transistor having a main transistor input terminal, a main transistor output terminal and a main transistor reference terminal, the peak amplifier stage comprising at least a peak power transistor having a peak transistor input terminal, a peak transistor output terminal and a peak transistor reference terminal;

the main transistor input terminal being electrically coupled to the main input terminal, the main transistor output terminal being electrically coupled to the main output terminal, the peak transistor input terminal being electrically coupled to the peak input terminal, the peak transistor output terminal being electrically coupled to the peak output terminal, the main transistor and peak transistor reference terminals being both electrically coupled to a reference terminal.

14. A radio frequency integrated circuit package comprising the radio frequency power amplifier as claimed in claim 6, the radio frequency integrated circuit package comprising a supporting means, an input lead and output lead, the input lead being electrically coupled to the input terminal, the output lead electrically coupled to the output terminal;

the main amplifier stage, the peak amplifier stage and the output power combiner being arranged in respective areas of the supporting means.

15. A radio frequency integrated circuit package as claimed in claim 14, the main amplifier stage being integrated in a first semiconductor die, the peak amplifier stage being integrated in a second semiconductor die and the output power combiner being integrated in a third semiconductor die, the first semiconductor die, the second semiconductor die and the third semiconductor die being mounted on the supporting means.

16. A radio frequency integrated circuit package as claimed in claim 14, the main amplifier stage, the peak amplifier stage and the output power combiner being integrated in a single semiconductor die mounted on the supporting means.

17. A radio frequency integrated circuit package as claimed in claim 15, the first electrical conductor being integrated in an electrically conductive layer of the third semiconductor die, the first electrical conductor being separated by the supporting means by at least an electrically isolating layer arranged to attach the third semiconductor die to the supporting means, the first electrical conductor being electrically connected to the first combiner terminal and second combiner terminal via electrically conductive via holes extending through the third semiconductor die to the electrically conductive layer.

18. A radio frequency integrated circuit package as claimed claim 11, the supporting means being electrically conductive and electrically connected to a reference potential.

19. A radio frequency base station for mobile communications, comprising:
- a transmitter comprising the radio frequency integrated circuit package as claimed claim 14, and
- an antenna electrically coupled to the output lead of the radio frequency integrated circuit package for transmitting the output signal through a communication channel.

20. A communications system comprising a radio frequency base station according to claim 19 and one or more mobile devices, the radio frequency base station being arranged to provide wireless transmission to one or more of the mobile devices.

* * * * *